United States Patent [19]
Dow

[11] Patent Number: 5,389,840
[45] Date of Patent: Feb. 14, 1995

[54] COMPLEMENTARY ANALOG MULTIPLIER CIRCUITS WITH DIFFERENTIAL GROUND REFERENCED OUTPUTS AND SWITCHING CAPABILITY

[75] Inventor: Ronald N. Dow, San Jose, Calif.

[73] Assignee: Elantec, Inc., Milpitas, Calif.

[21] Appl. No.: 974,129

[22] Filed: Nov. 10, 1992

[51] Int. Cl.$^6$ ............................................. H03F 3/45
[52] U.S. Cl. .................... 327/357; 330/252; 364/841; 327/356
[58] Field of Search ................ 328/158, 160, 161; 307/494, 490, 529, 498, 363; 330/252; 364/841; 257/566, 525

[56] References Cited

U.S. PATENT DOCUMENTS

| | | | |
|---|---|---|---|
| 3,602,707 | 8/1971 | Jones | 235/195 |
| 3,689,752 | 9/1972 | Gilbert | 307/229 |
| 4,017,720 | 4/1977 | Mattern | 235/150.52 |
| 4,156,283 | 5/1979 | Gilbert | 328/160 |
| 4,247,823 | 1/1981 | Vun Kannon | 328/160 |
| 4,268,759 | 5/1981 | Gilbert | 307/490 |
| 4,435,655 | 3/1984 | Hauser | 307/490 |
| 4,546,225 | 10/1985 | Pena-Finol et al. | 307/498 |
| 4,572,975 | 2/1986 | Bowers | 301/493 |
| 4,586,155 | 4/1986 | Gilbert | 364/841 |
| 4,906,873 | 3/1990 | Shoemaker | 307/498 |
| 4,931,674 | 6/1990 | Kub et al. | 307/529 |
| 4,978,873 | 12/1990 | Shoemaker | 307/498 |
| 4,999,521 | 3/1991 | Rusznyak | 307/498 |
| 5,079,151 | 1/1992 | Tanimoto | 330/256 |
| 5,107,150 | 4/1992 | Kimura | 307/529 |
| 5,115,409 | 5/1992 | Steep | 328/160 |

OTHER PUBLICATIONS

"A Precise Four-Quadrant Multiplier with Subnanosecond Response" by Barrie Gilbert; IEEE Journal of Solid-State Circuits, vol. SC-3, No. 4, Dec. 1968.

Primary Examiner—Timothy P. Callahan
Assistant Examiner—Dinh Le
Attorney, Agent, or Firm—Leo V. Novakoski; Albert C. Smith

[57] ABSTRACT

A four quadrant multiplier comprises X and Y input stages for coupling signals to a gain core amplifier for multiplication, wherein each of the input stages and the gain core amplifier further comprises a pair of complementary circuits, based on devices having opposite conductivity properties. The complementary X-input stage is a dual differential amplifier which provides balanced, differential outputs when loaded by the gain core differential amplifiers, due to separate cancellation of the npn and pnp base currents within the loaded X-input stage. Outputs from the cross-connected gain core amplifiers provide a pair of complete, ground referenced product signals having opposite phases. The X-input stage is also suitable for driving other complementary, differential stages such as two quadrant multipliers, voltage controlled amplifiers, and high speed analog multiplexing circuits.

26 Claims, 14 Drawing Sheets

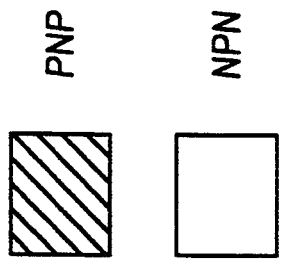
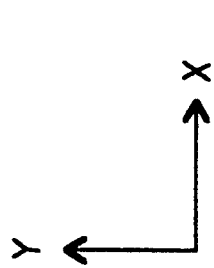
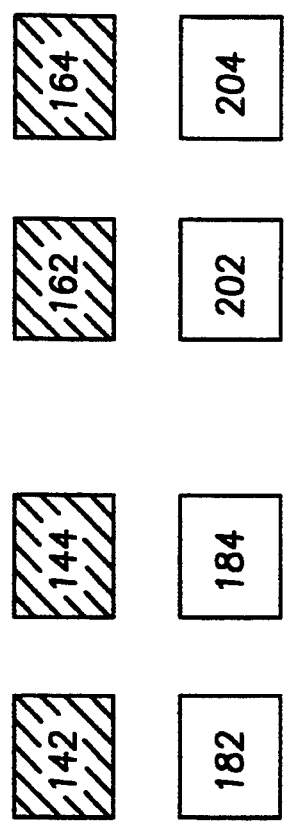
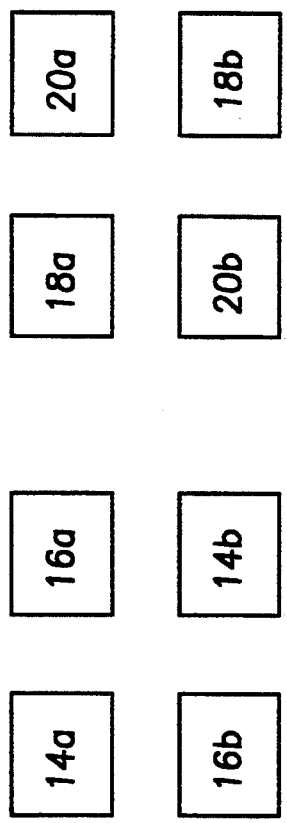
FIG. 10A (PRIOR ART)
FIG. 10B

COMPLEMENTARY ANALOG MULTIPLIER CIRCUITS WITH DIFFERENTIAL GROUND REFERENCED OUTPUTS AND SWITCHING CAPABILITY

BACKGROUND OF THE INVENTION

1. Field of the Invention

The present invention relates to the field of analog circuits for multiplying and switching signals. More specifically, it relates to analog circuits that utilize complementary device input and gain stages to accomplish the multiplying and switching functions.

2. Description of Related Art

Certain known analog multiplier circuits commonly include input stages and a gain core, for example, as illustrated in FIGS. 1A and 1B. Referring to FIG. 1A, an X-input stage comprises a differential voltage to differential current converter 22 and two diode load transistors 10, 12 connected to the outputs of differential converter 22. The Y-input stage comprises a differential voltage to differential current converter 24 and two pairs of transistors 14, 16 and 18, 20 connected to form differential amplifiers 26, 28, respectively. The common emitters of differential pairs 14, 16 and 18, 20 are connected to the outputs of the Y current converter 24 and the collectors of differential pairs 14, 16 and 18, 20 are cross connected to form the multiplier outputs.

The multiplying action of the circuit of FIG. 1A occurs in differential amplifiers 26, 28, which form the gain core of the multiplier circuit. Current output of X-input converter 22 generates logarithmically related voltages at the emitters of transistors 10, 12. Use of these voltages to drive the gain core differential amplifiers 26, 28 generates a linear translation of the X-input signals due to the anti-log action of the component transistors 14, 16, 18, 20. Application of the output current from the Y input converter 24 to the common emitters of differential pairs 14, 16 and 18, 20 determines the transconductance of differential amplifiers 26, 28. As a result, the product of the X and Y-input signals is generated as the difference between the outputs of the cross connected collectors of the differential pairs 14, 16 and 18, 20. The overall circuit obeys the equation;

$$(I_{o+} - I_{o-}) = (V_{x+} - V_{x-})(V_{y+} - V_{y-})K \qquad \text{(Eq. 1)}$$

where K is a constant that depends on the gain of the input differential converters and the DC bias current of the diodes and the output differential pairs. A two quadrant version of the multiplier circuit is shown in FIG. 1B.

Both circuits are very fast because all of the devices except those in the input differential voltage to current converters 22, 24 operate in current mode. However, each circuit also has the following limitations.

The output is directed toward the positive supply, $V_{CC}$. In addition, the complete product output signal is only obtained by taking the difference between the cross connected collectors of differential pair 14, 16 and 18, 20. To create a ground referenced output requires a differential to single ended conversion together with level shifting, which reduces the bandwidth and increases the complexity of the circuit.

Signal feedthrough from either input to the output with the other input grounded increases with frequency and severely limits the usable dynamic range of prior art multiplier circuits at higher operating frequencies. In addition, the null point will drift with temperature and die stress, affecting the usable dynamic range down to DC.

Further, the DC accuracy and usable dynamic range of the prior art multiplier is critically dependent on the matching and stability of diode connected transistors 10, 12 and gain core transistors 14, 16, 18, 20. These matching and stability problems commonly arise in integrated circuit realizations of the prior art as a result of die stress and diffusion and thermal gradients. In theory, such component mismatch problems can be reduced by cross-quading, whereby twin devices are connected in parallel with each transistor in the circuit. Device pairs are then arrayed to offset the effects of the various gradients. However, the resulting cross connected leads are difficult to make and the parallel connections offer only limited reduction in device mismatch problems.

Finally, the inputs of conventional multiplier circuits commonly operate in voltage mode. Use of voltage input signals limits the bandwidth of the circuit and reduces the dynamic input ranges to less than the total supply voltage.

SUMMARY OF THE INVENTION

In accordance with the present invention, complementary wideband multiplier circuits are provided that include ground referenced outputs, reduced signal feedthrough, improved input bandwidth, increased input signal compliance, and improved stability against die stress and thermal and diffusion induced gradients.

Referring to FIG. 2, there is shown a four quadrant multiplier in accordance with the present invention. The multiplier circuit comprises an X-input stage 30, including an amplifier 80 and input transistor pairs 40, 42 and 44, 46. Transistor pair 40, 42 and transistor pair 44, 46 have opposite conductivity characteristics, giving the X-input stage a complementary structure. The complementary structure of the X-input stage 30 provides balanced, differential outputs when loaded by a complementary differential stage.

The four quadrant multiplier further comprises a Y-input amplifier 90 which provides driving current to differential amplifier pairs 140, 160 and 180, 200. Differential amplifier pair 140, 160 comprises transistors having the same conductivity type as input transistors 40, 42 which drive their bases, and opposite conductivity type to those of differential amplifier pair 180, 200. Similarly, the conductivity type of differential amplifiers 180, 200 is the same as that of input transistors 44, 46 which provide their base drive. Input transistor pairs 40, 42 and 44, 46 are selected to have gain characteristics matching those of differential amplifier pairs 140, 160 and 180, 200, respectively.

The illustrated embodiment of the present invention provides an improved analog four quadrant multiplier for producing ground referenced product output signals. The output signals have greater immunity to offsets and offset instabilities created by mismatch of device characteristics arising from die stress and thermal or diffusion gradients. In addition, the present invention provides a multiplier circuit having broader bandwidth, greater input compliance range, and greater isolation from signal feedthrough when one input is zero.

The complementary input and gain stages of the present invention are readily adapted to form complementary two quadrant multipliers. In addition, independent control of the gain core differential amplifiers in the two and four quadrant circuits using shunt circuits provides high performance switching functions which can be further adapted to generate high speed, high isolation analog multiplexers.

BRIEF DESCRIPTION OF THE DRAWINGS

FIG. 4B is a schematic diagram of another embodiment of an input amplifier in accordance with the present invention.

FIG. 4C is a schematic diagram of yet another embodiment of an input amplifier in accordance with the present invention.

FIG. 10A is a block diagram of the gain core device layout in a conventional cross-quaded integrated circuit and in FIG. 10B is a block diagram of the gain core device layout in a circuit having the complementary structure of the present invention.

DETAILED DESCRIPTION OF THE INVENTION

Figure 3:
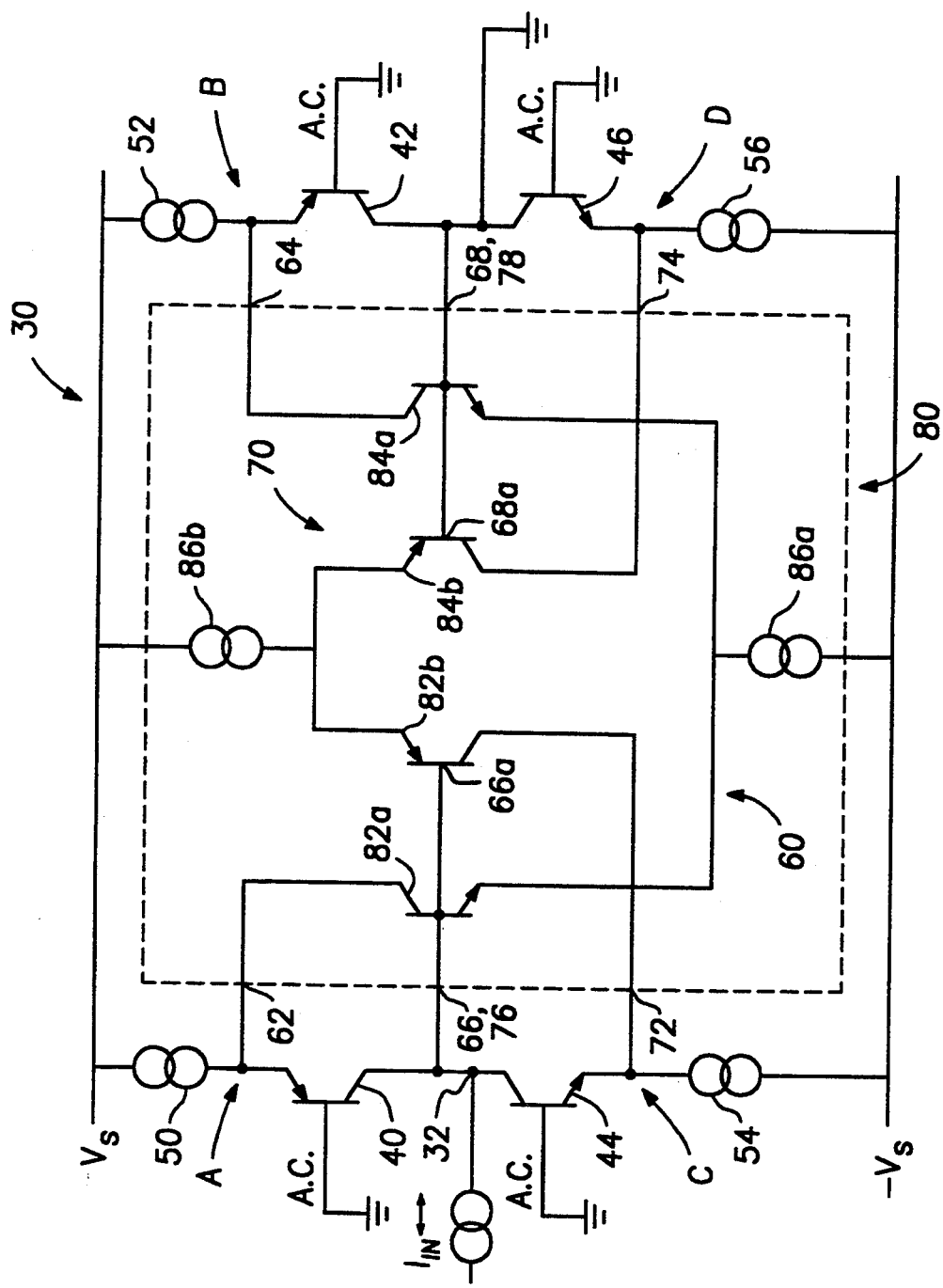
FIG. 3 is a schematic diagram of the X-input stage in accordance with the present invention, including one embodiment of an input amplifier.

Referring to FIG. 3, there is illustrated an X-input stage 30 of the present invention, including an X-input signal amplifier 80 and first and second transistor pairs 40, 42 and 44, 46, respectively. The X-input amplifier 80 comprises a pair of differential amplifier circuits 60, 70 including transistors having opposite conductivity types. In the subsequent discussion, herein, differential amplifiers are identified according to the conductivity type of their component transistors. Thus, differential amplifier 60 is an npn differential amplifier while differential amplifier 70 is a pnp differential amplifier.

Differential amplifiers, which are well known in the art, are effective to generate differentially related currents at their outputs in response to a voltage or current difference between their inputs. Differential amplifiers may also be driven with a single ended signal at one input if the other input is grounded.

Figure 2:
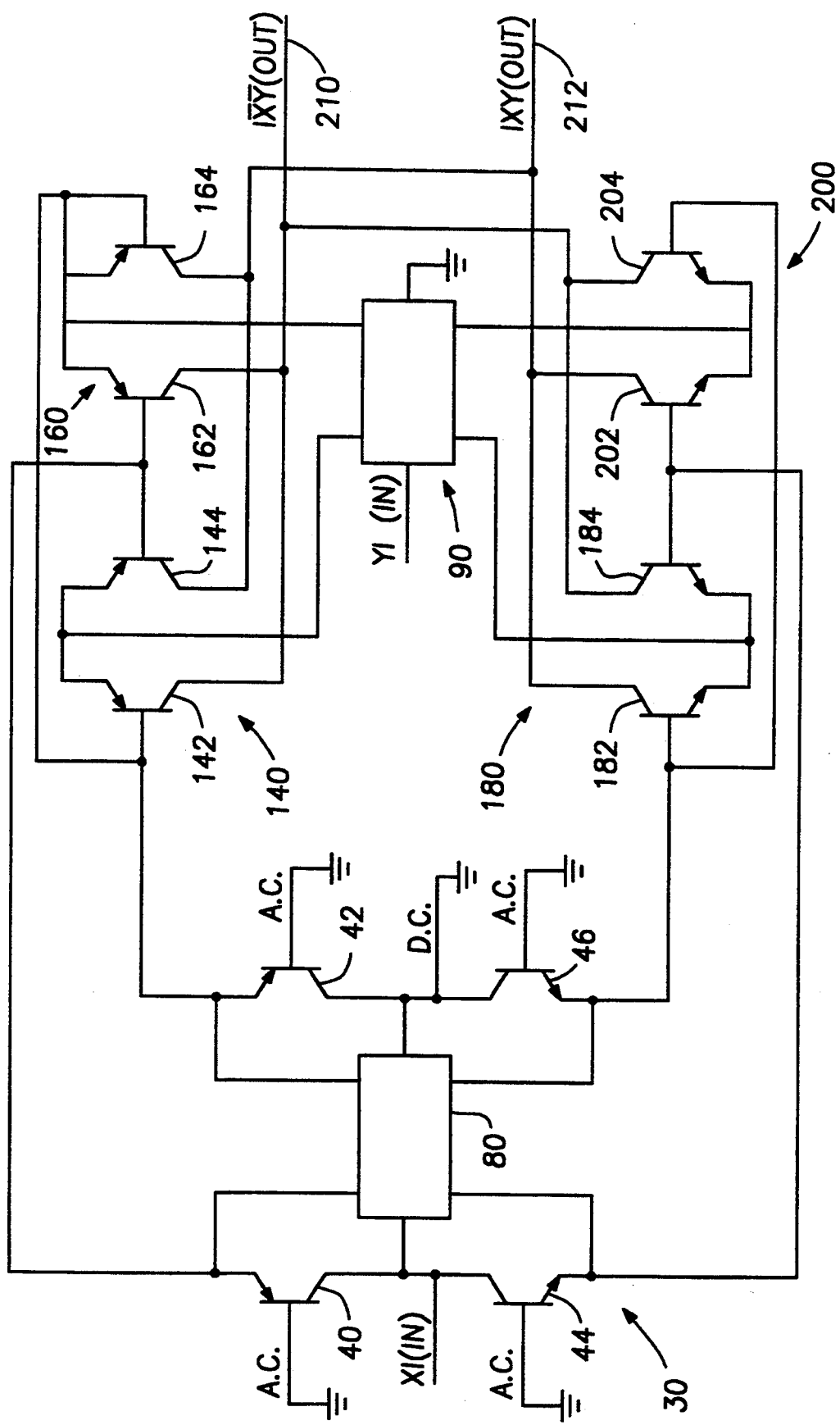
FIG. 2 is a schematic diagram of a four quadrant multiplier circuit in accordance with the present invention.

The basic differential amplifier 60 of FIG. 2 comprises transistors 82a, 84a connected in a common emitter configuration. The bases of transistors 82a, 84a form differential inputs 66, 68 and the collectors of transistors 82a, 84a form differential outputs 62, 64. A current source 86a sinks current from the common emitters of transistors 82a, 84a, holding the total emitter current fixed. The distribution of this emitter current between the collectors of transistors 82a, 84a is determined by the signal applied to input 66 with input 68 grounded. Thus, a signal at input 66 produces differentially related currents at outputs 62, 64. Differential amplifier 70 corresponds to the basic differential amplifier circuit 60 with npn transistors 82a, 84a and the npn components of current source 86a replaced by pnp transistors 82b, 84b and current source 86b. Complementary differential amplifiers 60, 70 are powered from opposite supply voltages, $(+/-) V_S$.

Figure 4B:
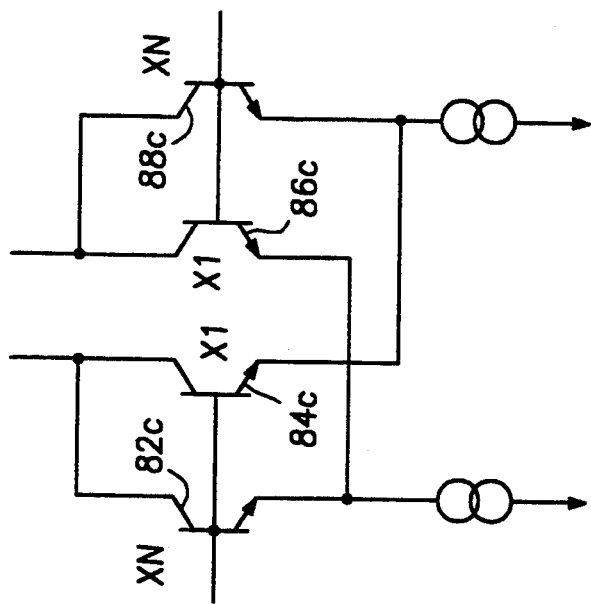
FIGS. 4A-4C show a schematic diagram of one embodiment of an input amplifier in accordance with the present invention.
Figure 4C:
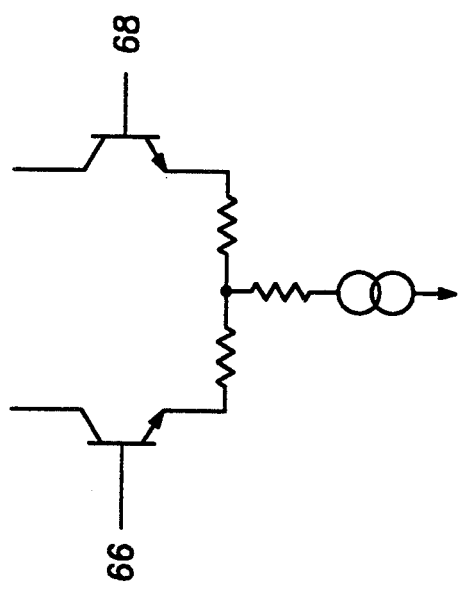
Figure 4A:
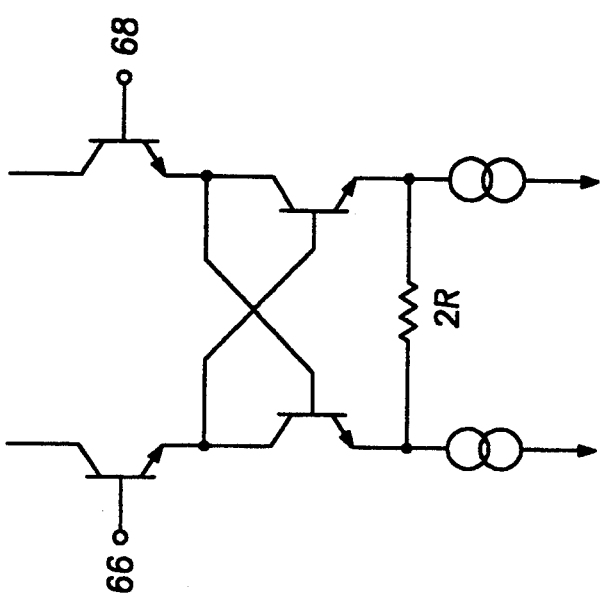

In addition to the basic differential amplifier circuit of FIG. 3, any of the alternative circuit embodiments of FIG. 4A, 4B, or FIG. 4C may be used as an npn differential amplifier in the X-input amplifier 80. For example, the circuit of FIG. 4A is a Caprio differential stage which provides lower signal distortion but slower response than the basic amplifier circuit of FIG. 3. The differential amplifier of FIG. 4B comprises two offset differential transistor pairs 82c, 86c and 84c, 88c connected back to back. Xn is a parameter corresponding to the emitter area ratio of transistors 82c, 86c and that of transistors 88c, 84c. The parameter n is generally a small integer number greater than 1. In the preferred embodiment n is between 3 and 7. The differential amplifier of FIG. 4B is faster and has lower distortion than the differential amplifiers of FIGS. 3, 4A, and 4C, where the latter is a simple differential pair having emitter degeneration. Differential amplifiers 70 corresponding to those of FIGS. 3, 4A, and 4B may be realized using pnp type transistor elements.

Referring again to FIG. 3, first and second transistor pairs 40,42 and 44,46 are operative to transform a signal at X-input stage 30 for use in the gain core. Transistor 40 has its collector connected to an input 32 of X-input stage 30 and its emitter connected to a current source 50 and to output 62 of differential amplifier 60. Ignoring the small transistor base currents, the quiescent current from current source 50 will be partitioned equally between the emitter of transistor 40 and output 62 of npn differential amplifier 60. Similarly, transistor 42 has its emitter connected to differential amplifier output 64 and current source 52 and its collector connected to ground. The quiescent current distribution from current source 52 is the same as that of current source 50. The bases of transistors 40, 42 are coupled to an AC ground, which represents a DC voltage, including but not limited to absolute ground, which has no AC voltage component.

The complementary circuit is formed by second transistor pair 44, 46 with differential amplifier outputs 72, 74 and current sources 54, 56, respectively. Thus, transistor 44 has its collector connected to input 32 and its emitter connected to current source 54 and to output 72 of pnp differential amplifier 70. Similarly, transistor 46 has its collector connected to ground and its emitter connected to current source 56 and to output 74 of pnp differential amplifier 70. The bases of transistors 44, 46 are also coupled to an AC ground.

An advantage of X-input stage 30 is that when points A, B, C, and D are loaded by the gain core amplifiers 140, 160, 180, 200, the base currents in the npn transistors 44, 46, 82a, 84a cancel to within the base current offsets of such devices, as do those of pnp transistors 40, 42, 82b, 84b. Since any mismatch in transistor base currents will be transmitted to the gain core, the output signals will be offset, causing signal feedthrough. The cancellation of base currents in X-input stage 30 minimizes this source of error.

Operation of the X-input stage 30 is illustrated for the case where a current signal is applied to input 32. In this description, the polarity of a current is defined such that input currents which flow into input stages 30, 90 are referred to as positive currents and those that flow out of input stages 30, 90 are referred to as negative currents.

Referring to the circuit of FIG. 3, a positive input current, $I_{IN}$, increases the collector current of npn transistor 82a from its quiescent level, while the collector current of npn transistor 84a is decreased by a corresponding amount (since the total emitter current is fixed by current source 86a). The additional current flowing into the collector of transistor 82a from current source 50 is provided by diverting a corresponding amount of current from the emitter of transistor 40. At the same time, the reduced collector current in transistor 84a results in corresponding increase in the current flowing from current source 52 to the emitter of transistor 42. Thus, the decrease in emitter current of transistor 40 is accompanied by a symmetrical increase in the emitter current of transistor 42.

The complementary circuit formed by npn transistor pair 44, 46 and differential amplifier 70 provides a symmetrical response to a positive current input. In this case, a positive input current reduces the current flowing from output 72 (collector of transistor 82b) into current sink 54 and this decrease is compensated by increased current flowing through npn transistor 44 into current sink 54. Correspondingly, the current flowing from output 74 into current sink 56 is increased by a positive input current and this increase is compensated by a reduction in the current flowing into current sink 56 through npn transistor 46.

The increased emitter currents in transistors 42, 44 lead to corresponding increases in their collector currents, while the decreased emitter currents of transistors 40, 46 lead to corresponding decreases in the collector currents in those transistors. The resulting changes in the emitter voltages of transistors 40, 42, 44, 46, are given by the Ebers-Moll equation, $$I_C = I_S(e^{V_{BE}/V_T} + 1) \quad \text{(Eq. 2)}$$

Here, $V_{BE}$ is the base to emitter voltage of the transistor, $I_S$ is the saturation current of the transistor, and $V_T = kT/q$, where k is Boltzmann's constant, T is the absolute temperature and q is the charge of the charge carrier.

According to (Eq. 2), the voltage changes at points A, B, C, and D, which correspond to the emitters of transistors 40, 42, 44, 46, respectively, are logarithmically related to the positive input current such that:

$$V^+{}_p - V^-{}_p = V^+{}_n - V^-{}_n = \log_e[(I - 0.5I_{in})/(I + 0.5 - I_{in})] \quad \text{(Eq. 3)}$$

Here $V^+{}_p - V^-{}_p$ is the voltage difference between points A and B, and $V^+{}_n - V^-{}_n$ is the voltage difference between points C and D. The equality between $V^+{}_p - V^-{}_p$ and $V^+{}_n - V^-{}_n$ in the present invention is assured by the separate cancellation of the npn and pnp base currents described above and the use of reasonably matched transistors in the X-input stage.

In summary, X-input stage 30 generates equal voltage differences $V^+{}_p - V^-{}_p$ and $V^+{}_n - V^-{}_n$, which are logarithmically related to a current signal at input 32. The voltage differences, $V^+{}_p - V^-{}_p$ and $V^+{}_n - V^-{}_n$, are then applied to the bases of differential amplifier pairs 140, 160 and 180, 200, respectively, which form the gain core of the multiplier circuit. There the signals are transformed by an anti-log conversion and multiplied by Y-input signal through the emitter current dependence of the transconductance of differential amplifier pairs 140, 160 and 180, 200. The X-input stage 30 may also be used in other circuits which require balanced complementary differential inputs. Examples of switching circuits based on the X-input stage 30 are discussed below.

Figure 5:
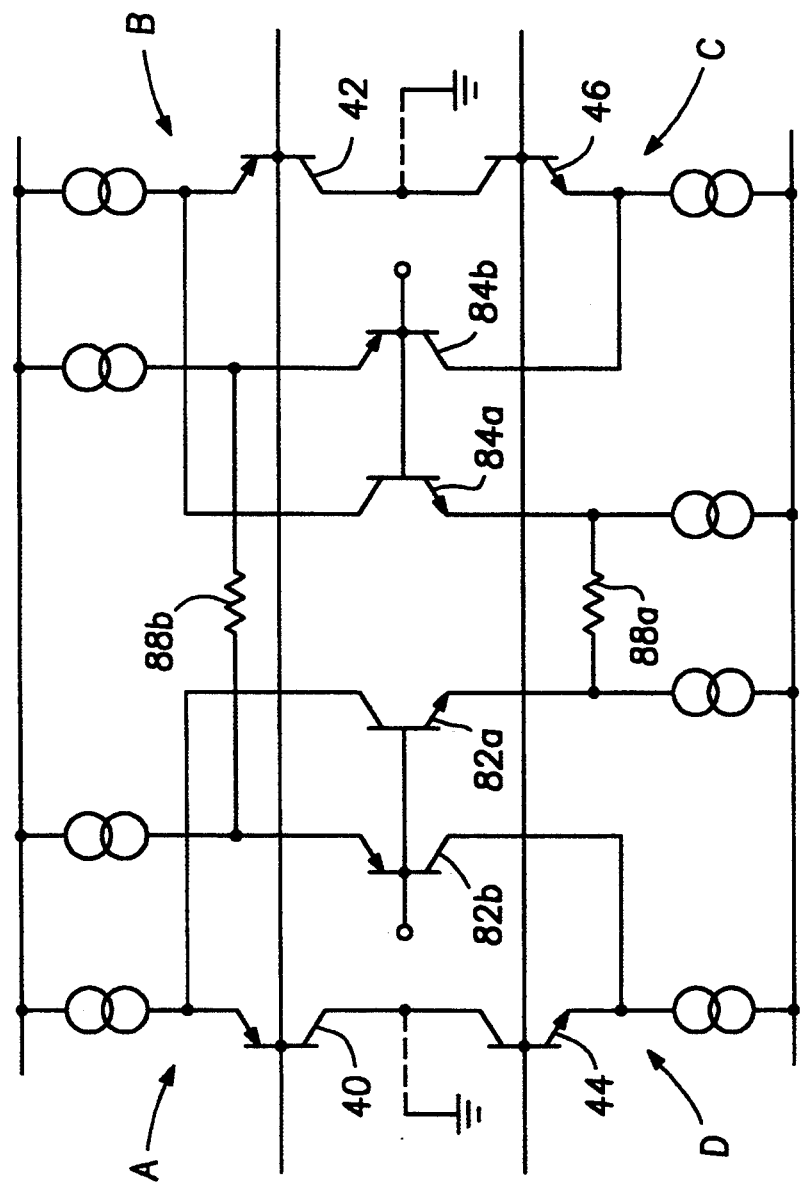
FIG. 5 is a schematic diagram of an input amplifier circuit appropriate for differential voltage inputs.

A simple modification of the X-input amplifier 80 allows the X-input stage 30 of the present invention to be driven by voltage rather than current inputs. Referring to FIG. 5, there is shown an X-input amplifier 80 appropriate for differential voltage input signals. In this alternative embodiment of the X-input circuit, the collectors of transistors 40, 44 are disconnected from the bases of transistors 82a, 82b and the collectors of transistors 42, 46 are disconnected from the bases of transistors 84a, 84b. In addition, identical resistors 88a, 88b have been added between the emitters of transistors 82a, 84a and between the emitters of transistors 82b, 84b, respectively. A differential voltage input to the circuit of FIG. 5 generates output voltages at points A, B, C, and D suitable for multiplication by the Y-input stage circuitry in the manner described above.

Thus, X input stage 30 may be driven by an input signal that is a single ended voltage signal, a differential voltage signal, a single ended current signal or a differential current signal.

Figure 6:
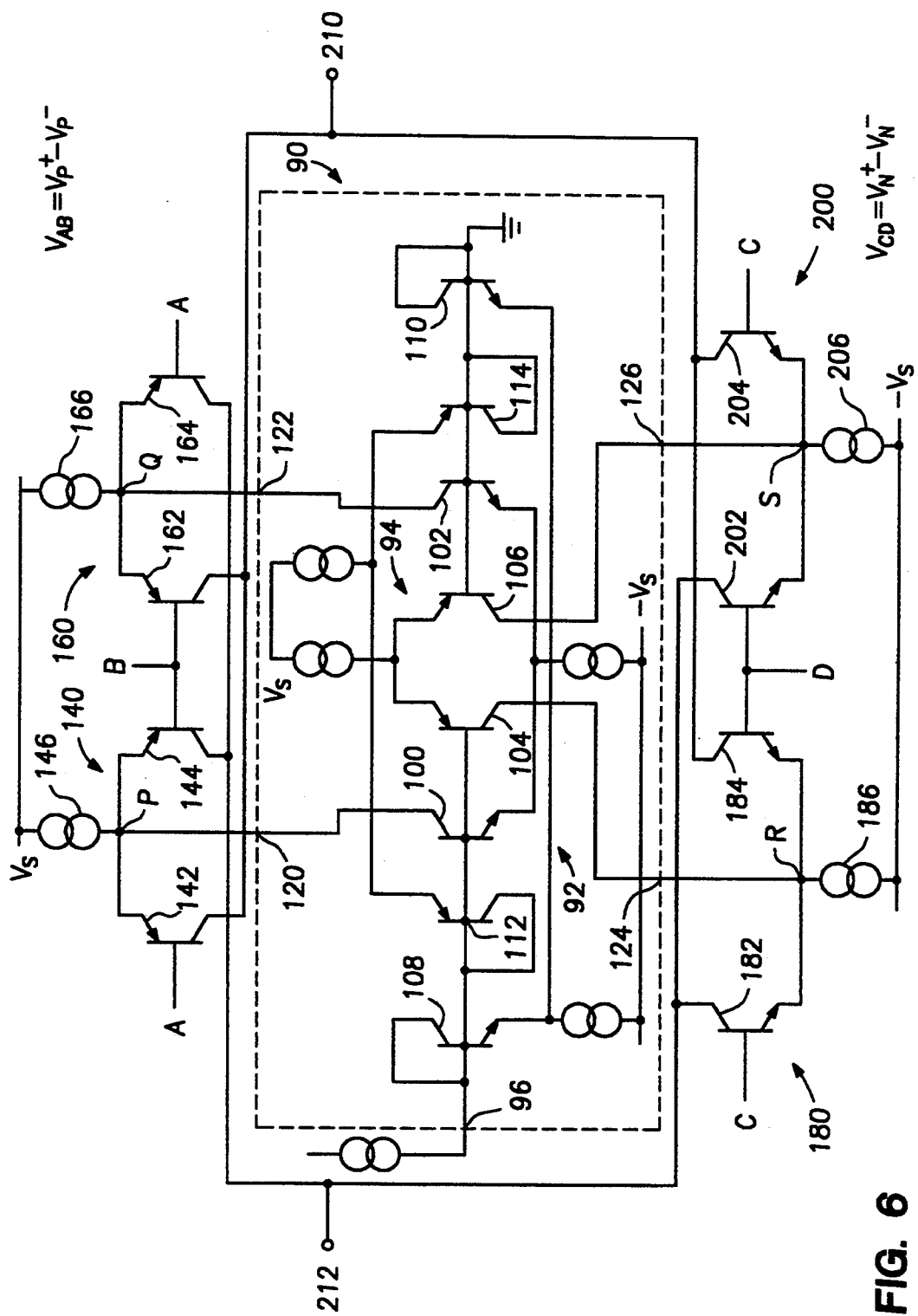
FIG. 6 is a schematic diagram of the Y-input stage, including one embodiment of an input amplifier in accordance with the present invention.

Referring now to FIG. 6, there is shown a preferred embodiment for the Y-input stage of the present invention, including Y-input amplifier 90 and complementary differential amplifier pairs 140, 160 and 180, 200. Y-input amplifier 90 comprises npn transistor pair 100, 102 and pnp transistor pair 104, 106 which are connected to form complementary differential amplifiers 92 and 94, respectively. Differential amplifiers 92, 94 correspond to the differential amplifiers 60, 70 of X-input amplifier 30. As with X-input amplifier, any of the differential stages of FIG. 4 may be used in place of differential amplifiers 92, 94.

In addition to differential amplifier pair 92, 94, the preferred embodiment of Y-input amplifier includes a second pair of npn transistors 108, 110 and a second pair of pnp transistors 112, 114, all of which are connected as diodes. The transistors 108, 110, 112, 114 are included to make the input impedance characteristics of the Y-input 96 similar to those of the X-input 32. In the latter circuit, each of the transistor pairs 40, 82a and 44, 82b are connected to form a folded cascode. As a result, input 32 is the input of a closed loop unity gain current amplifier. Such a closed loop current amplifier cannot be implemented in the Y-input amplifier because the collector currents of differential amplifiers 140, 160, 180, 200 carry both X and Y signal components. However, by adding the diode connected transistor pairs 108, 110 and 112, 114 to each side of the complementary differential pairs 100, 102 and 104, 106, a Y-stage having input characteristics comparable to those of the X-input stage 30 is created.

Alternative embodiments of the Y input amplifier having the above described input impedance characteristics can be constructed from any of the differential amplifier circuits of FIGS. 4A, 4B, 4C. To do so, diode connected transistor configurations which correspond to the input transistor configurations of the FIGS. 4A, 4B, 4C circuits in the same way that transistor pairs 108, 110 and 112, 114 correspond to input transistors 100, 102 and 104, 106, are added to the FIGS. 4A, 4B, 4C circuits.

Figure 7:
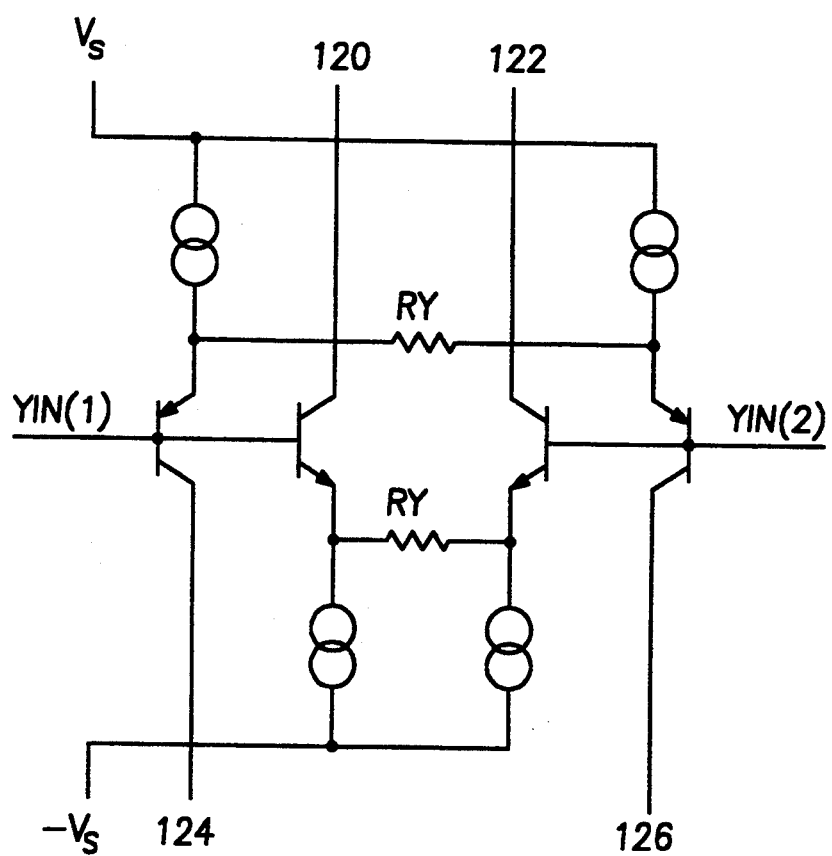
FIG. 7 is a schematic diagram of a Y-input amplifier appropriate for voltage input signals.

With the circuit configuration as described above, transistor pair 104, 106 provides differentially related currents to outputs 124, 126 according to the signal current applied at input 96. Currents having the same magnitude but opposite direction of flow are generated at Y amplifier outputs 220, 122 by the transistor pair 100, 102. As with the X-input stage, the Y-input stage may be modified to accept voltage input signals. For example, the circuit of FIG. 7 accepts differential voltage input signals for the Y-input stage.

Thus, Y input stage 90 may be driven by an input signal that is a single ended voltage signal, a differential voltage signal, a single ended current signal, or a differential current signal.

The second element of Y-input stage 90 is the gain core, comprising differential amplifiers 140, 160, 180, 200. The bases and collectors of differentially connected pnp transistors 142, 144 and 162, 162 form the inputs and outputs of differential amplifiers 140 and 160, respectively. Likewise, the bases and collectors of differentially connected npn transistor 182, 184 and 202, 204 form the inputs and outputs of npn differential amplifier pair 180, 200.

The signal from X-input stage 30 is coupled to differential amplifier pairs 140, 160 and 180, 200 through the bases of their component transistors. Thus, the difference between the emitter voltages of pnp transistor pair 40, 42, $V^+_p - V^-_p$, is applied across the bases of both pnp transistor pair 142, 144 and pnp transistor pair 162, 164. In the complementary circuit, the difference between the emitter voltages of npn transistor pair 44, 46, $V^+_n - V^-_n$, is applied across the bases of both npn transistor pair 182, 184 and npn transistor pair 202, 204.

The Y-input signal is coupled to differential amplifiers 140, 160, 180, 200 through the common emitters of their component transistors. Thus, the common emitters of differential pairs 142, 144 and 162, 164 are connected to outputs 120, 122, respectively, of Y-input amplifier 90. In like manner, the common emitters of differential pairs 182, 184 and 202, 204 are connected to outputs 124, 126, respectively, of Y-input amplifier 90. Further, the common emitter of each of the differential amplifiers 140, 160, 180, 200 is connected to current source 146, 166, 186, 206, respectively.

In accordance with the Ebers-Moll transistor model, the transconductance of the differential amplifiers is, $$g_m = I_E / V_T,$$ (Eq. 4)

where $I_E$ is the common emitter current. Thus, the common emitter currents and consequently, the transconductance gains of the differential amplifier pairs 140, 160 and 180, 200 are determined by the currents generated at outputs 120, 122 and 124, 126 of the Y-input amplifier 90. Since the voltage differences driving the bases of differential amplifier pairs 140, 160 and 180, 200, $V^+_p - V^-_p$ and $V^+_n - V^-_n$, respectively, are logarithmically related to the X-input signal, the product of X and Y-input signals can be produced from the collector currents of gain core transistors 142, 144, 162, 164, 182, 184, 202, 204.

Product signal is obtained by cross connecting the outputs of differential amplifier pairs 140, 160 and 180, 200 with respect to the input voltages driving their component transistors. Accordingly, the collectors of pnp transistors 142, 162 are connected together as are the collectors of npn transistors 184, 204. Further, the collectors of the npn transistor pair 184, 204 are connected to those of the pnp transistor pair 142, 162 to form a first output 210 of the multiplier circuit. The collectors of npn transistors 144, 164 and those of npn transistors 182, 202 are connected in an analogous manner to form a second output 212 of the multiplier circuit.

The complementary structure of the multiplier circuit insures that the quiescent DC currents in the collectors of the pnp gain core transistors 142, 144, 162, 162 approximately cancel those on the collectors of the npn gain core transistors 182, 184, 202, 204, so that only the difference between npn and pnp base currents appear at the outputs 210, 212. In addition, the complementary structure of the multiplier circuit insures that outputs 210 and 212 separately carry ground referenced signals proportional to the product of the X and Y input signals and 180° out of phase. By taking the difference between these signals, offset, offset drift, and output signal amplitude are improved by a factor of two. High frequency distortion and settled isolation performance are also improved. Further, high frequency signal feedthrough is reduced by a large factor and the DC offset caused by pnp/npn Beta mismatch is reduced by a factor of 10 to 30.

Figure 8:
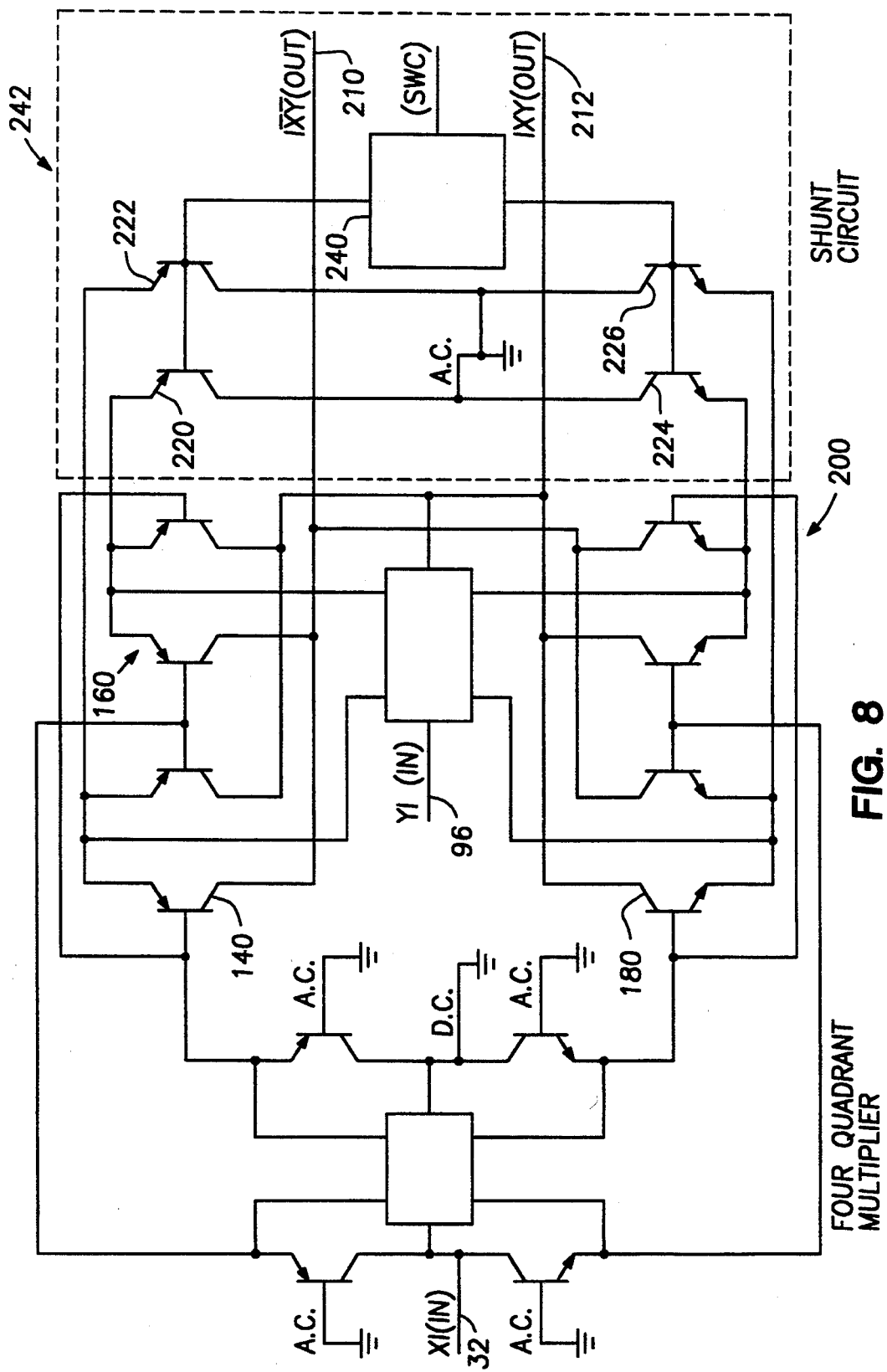
FIG. 8 is a schematic diagram of a high performance switching circuit for use with the present invention.

Even with the signal improvements obtained by taking difference between the signals at outputs 210, 212, the null point feedthrough rejection is only about −60 dB at best and can degrade with temperature, time, and frequency. Referring now to FIG. 8, there is shown a shunt circuit 242 which has been added to a complementary multiplier to create a high speed switching circuit having superior isolation and high frequency feedthrough rejection. A switching circuit 240 such as a ramp generator, provides complementary voltages to the bases of shunt transistors 220, 222, 224, 226. Transistors 220, 222 are completely shut off when the voltages at their bases equal or exceed the voltages at the emitters of differential amplifiers 140, 160. Likewise, transistors 224, 226 are completely shut off when the voltages at their bases are less than or equal to the voltages at the emitters of differential amplifiers 180, 200. In this state, the shunt circuit is disabled, allowing the multiplier circuit to operate normally.

The shunt circuit 242 is activated by bringing the bases of transistor 220, 222 a $V_{BE}$ drop below the inputs of differential amplifiers 140, 160 (points A and B) and simultaneously bringing the bases of transistors 224, 226 a $V_{BE}$ drop above the inputs of differential amplifiers 180, 200 (points C and D). As a result, all bias and signal current is shunted away from the gain core differential amplifiers 140, 160, 180, 200. In this state, the gain core is completely shut down and the signal at outputs 210, 212 is zero. There is no output signal even down to DC and the outputs 210, 212 are effectively isolated from the inputs 32, 96. In addition, the shunt circuit operates with a voltage swing of approximately 2 $V_{BE}$, which can be provided by drive circuitry as shown in FIG. 8. In addition, the virtual ground current inputs of the preferred embodiment of X-input stage 30 significantly enhance the high frequency switch off isolation performance by suppressing signal feedthrough from input to output.

Figure 9A:
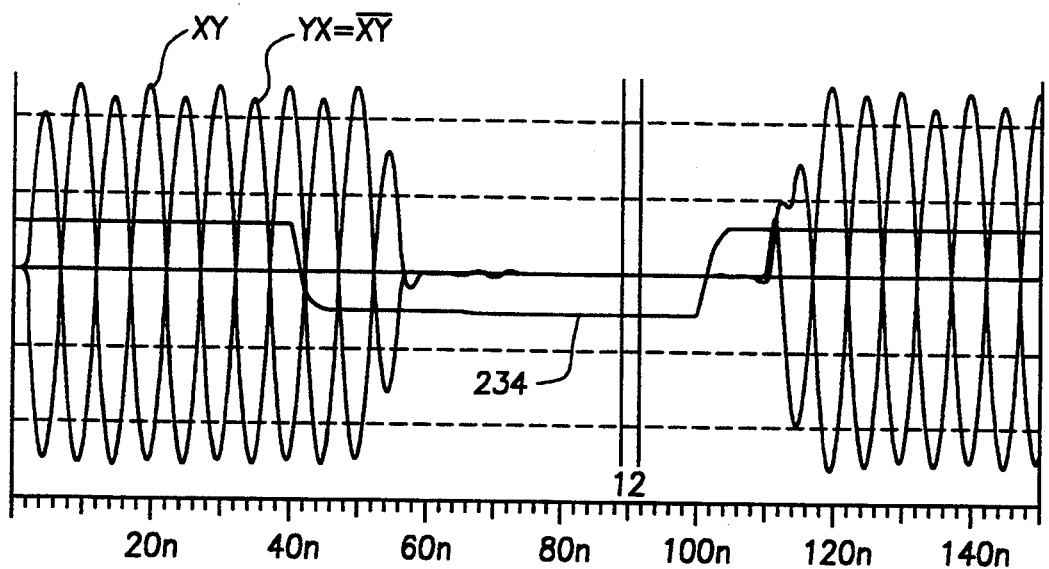
FIGS. 9A and 9B are simulations of the individual output signals and the difference signal for the four quadrant multiplier, including the switching signal.
Figure 9B:
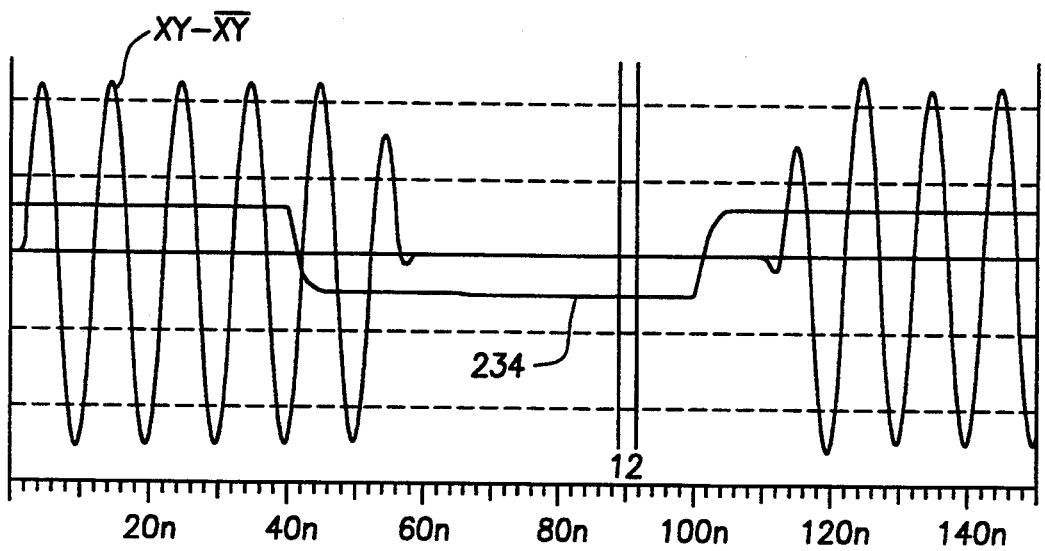

Referring now to FIG. 9A, there is shown a product signal XY from output 210 and a complementary product signal YX from output 212. The trace 234 represents the switching signal which, for example, could be a voltage at input 250 of the ramp generators 240 of FIG. 8. The separate signals XY, YX are almost entirely shut off within 20 nanoseconds. However, some residual signal ringing is apparent for an additional 10 nanoseconds. In FIG. 9B, there is shown the differential signal XY-YX, taken between the complementary outputs 210, 212. The reduction in ringing in the differential signal XY-YX relative to the separate signals XY, YX is readily apparent.

Figure 1A:
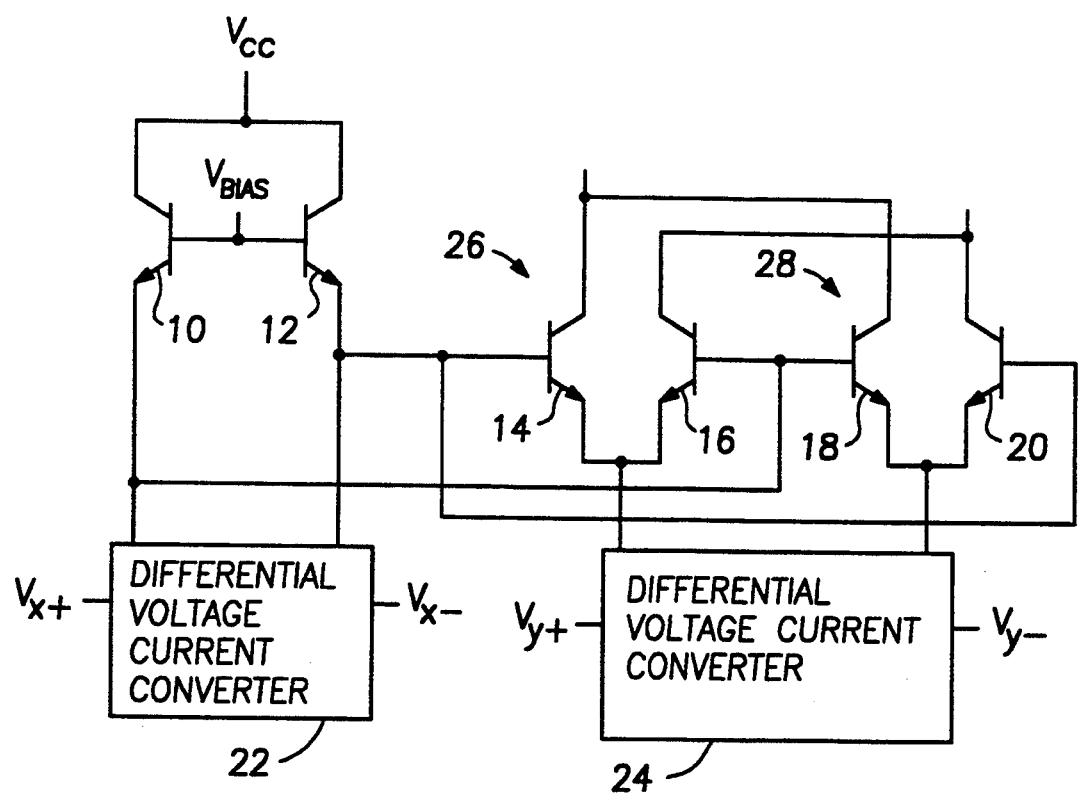
FIG. 1A is a schematic diagram of conventional four quadrant multiplier circuit.
Figure 1B:
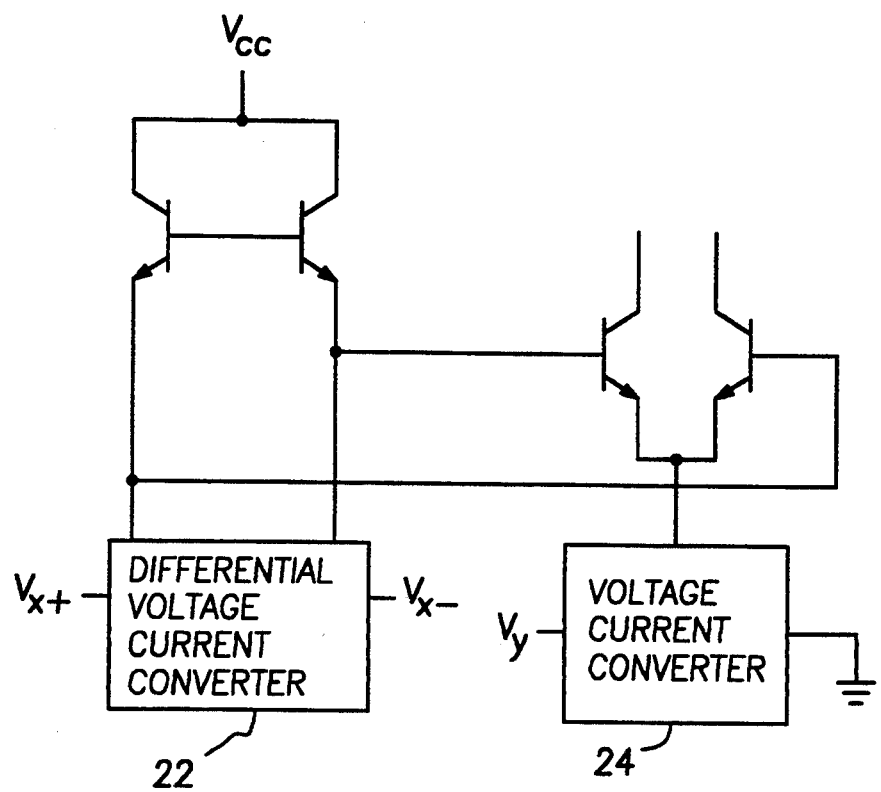
FIG. 1B is a schematic diagram of a conventional two quadrant multiplier circuit.

Certain advantages relating to integrated circuit realizations of the present invention also follow from its complementary structure. Referring to FIG. 10A, there is shown a block diagram representing the geometrical arrangement of gain core devices in a single conductivity type, cross-quaded four quadrant multiplier such as the type shown in FIG. 1. Transistors 14a, 16a comprise a differential amplifier 26a and each is connected in parallel with a twin transistor 14b, 16b, which form a second differential amplifier 26b.

In a cross-quaded circuit, twin transistors 14a, 14b and 16a, 16b are positioned at opposite corners of a rectangle. This geometry compensates for diffusion, stress, and thermal gradients along the x and y directions. However, the connections are difficult to implement due to the need for hardwired connections between devices at opposite corners of a rectangular array. In practice, the connections can be made in separate metal layers, a solution which requires two additional processing steps. Further, the consequent wiring congestion is usually relieved by increasing the spacing between paired devices. As a result, the advantages of cross-quading are somewhat offset by the greater distances over which the various gradients operate.

Referring to FIG. 10B, there is shown the corresponding device arrangement for the gain core of the present invention. In this case, the desired rectangular geometry is more easily achieved since the complementary npn and pnp devices comprising gain core differential amplifiers 140, 160, 180, 200 are connected in series and the collector contacts can be used as cross-unders. By positioning pnp transistors 142, 144 and 162, 164 in a linear array facing the linear array formed by npn transistors 182, 184 and 202, 204, the inter-device connections are simplified. Consequently, the devices can be arrayed over a smaller chip area, limiting the distances over which any gradients operate. In addition, the complementary structure of the gain core differential amplifiers 140, 160, 180, 200 provides twice the signal gain relative to the offset and offset drifts produced by the gradients.

Figure 11:
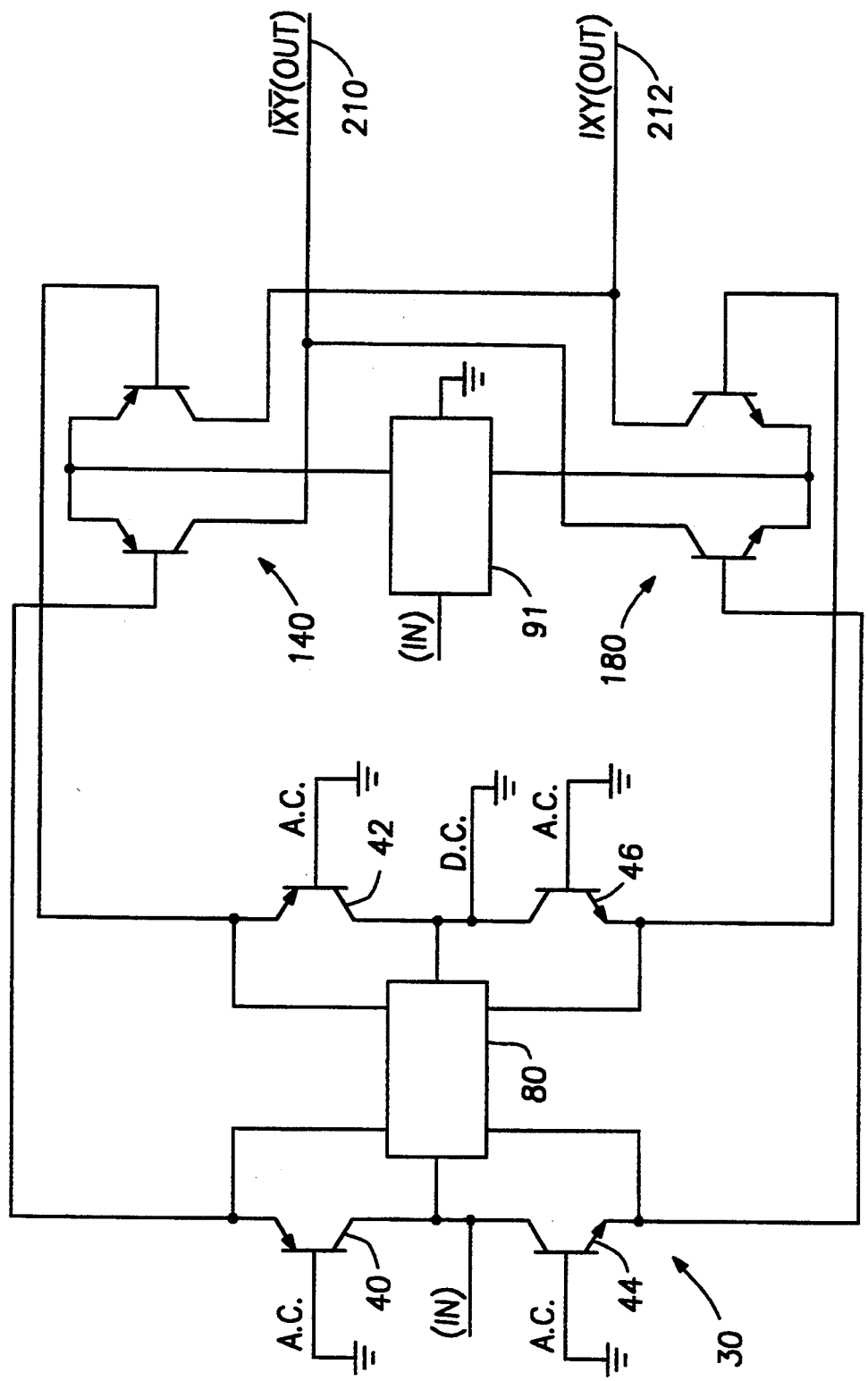
FIG. 11 shows a two quadrant multiplier circuit in accordance with the present invention.

Referring now to FIG. 11, there is shown a two quadrant multiplier in accordance with the present invention. The X-input stage 30 of the two quadrant multiplier is the same as the X-input stage discussed in connection with the four quadrant multiplier. Accordingly, the X input amplifier 80 may comprise any of the circuits shown in FIGS. 3, 4, and 5. The Y-input stage of the two quadrant multiplier circuit comprises a dual current output control amplifier 91, examples of which are well known in the art. The gain core comprises a single pair of complementary differential amplifiers 140, 180. As with the four quadrant circuit, the two quadrant multiplier may operate with either current or voltage inputs to the X and Y input stages 80, 90. Thus, the complementary two quadrant multiplier of FIG. 11 provides ground referenced outputs 210, 212 having reduced signal feedthrough, increased signal compliance, and improved input bandwidth.

Figure 12:
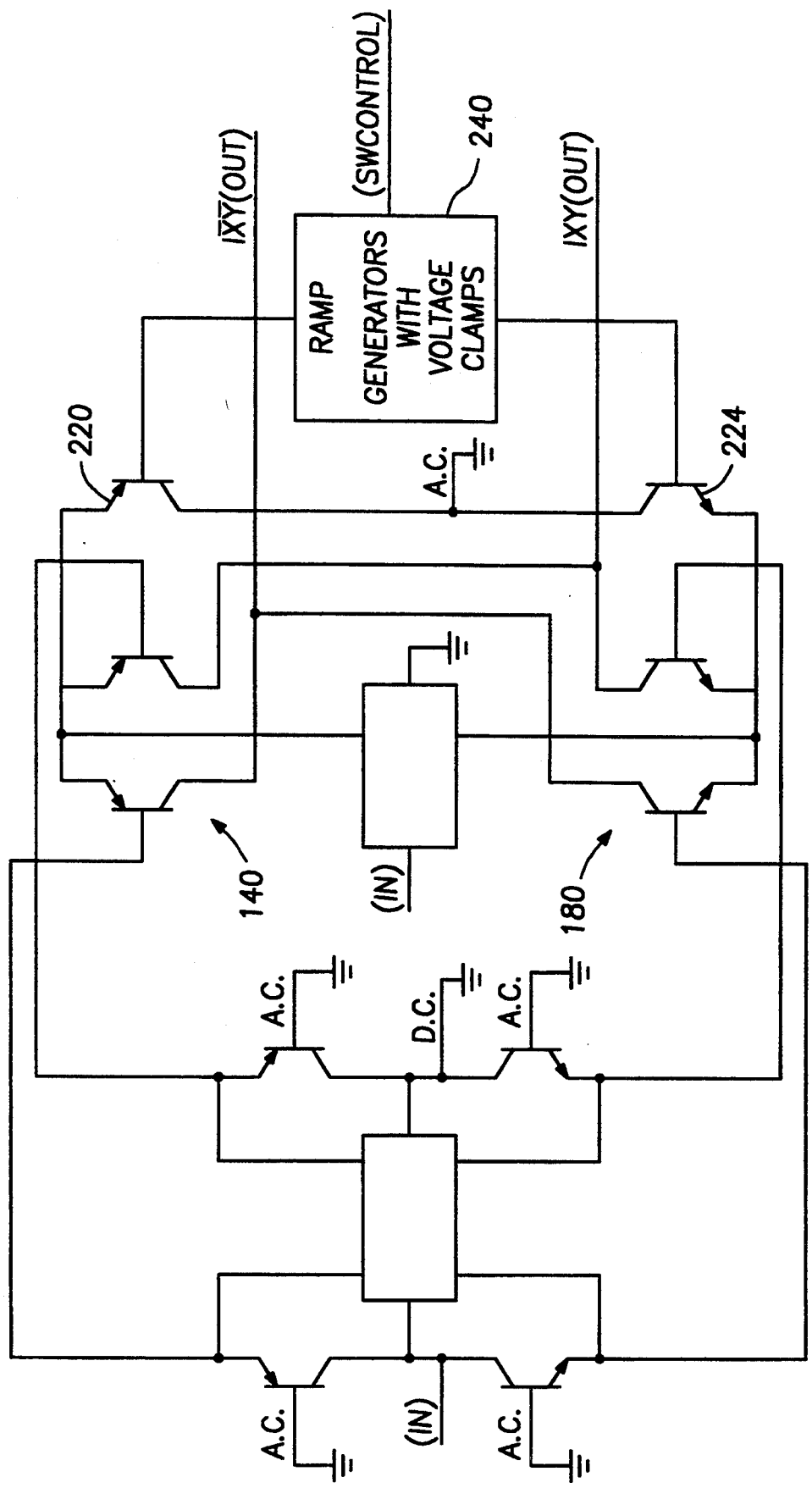
FIG. 12 shows a high performance switching circuit in accordance with the present invention.

Referring now to FIG. 12, there is shown a voltage controlled amplifier having a high performance switching function, which is based on the complementary two quadrant multiplier of FIG. 11. A complementary pair of shunt transistors 220, 224 driven by a switching circuit 240 such as a ramp generator, is added to the two quadrant multiplier of FIG. 11. Thus, pnp transistor 220 has its emitter connected to the common emitter of differential amplifier 140, its collector connected to ground, and its base connected to the output of ramp generator 240. Similarly, npn transistor 224 has its emitter connected between the common emitter of differential amplifier 180, its collector connected to ground, and its base connected to ramp generator 240.

The resulting shunt circuit 242 is a two quadrant analogue of the four quadrant shunt circuit shown in FIG. 8. Thus, the gain core is turned on and off as the voltages at the bases of shunt transistors 220, 224 are changed relative to those at the bases of differential amplifiers 140, 180 in the manner described in conjunction with the switching circuit of FIG. 8.

Figure 13:
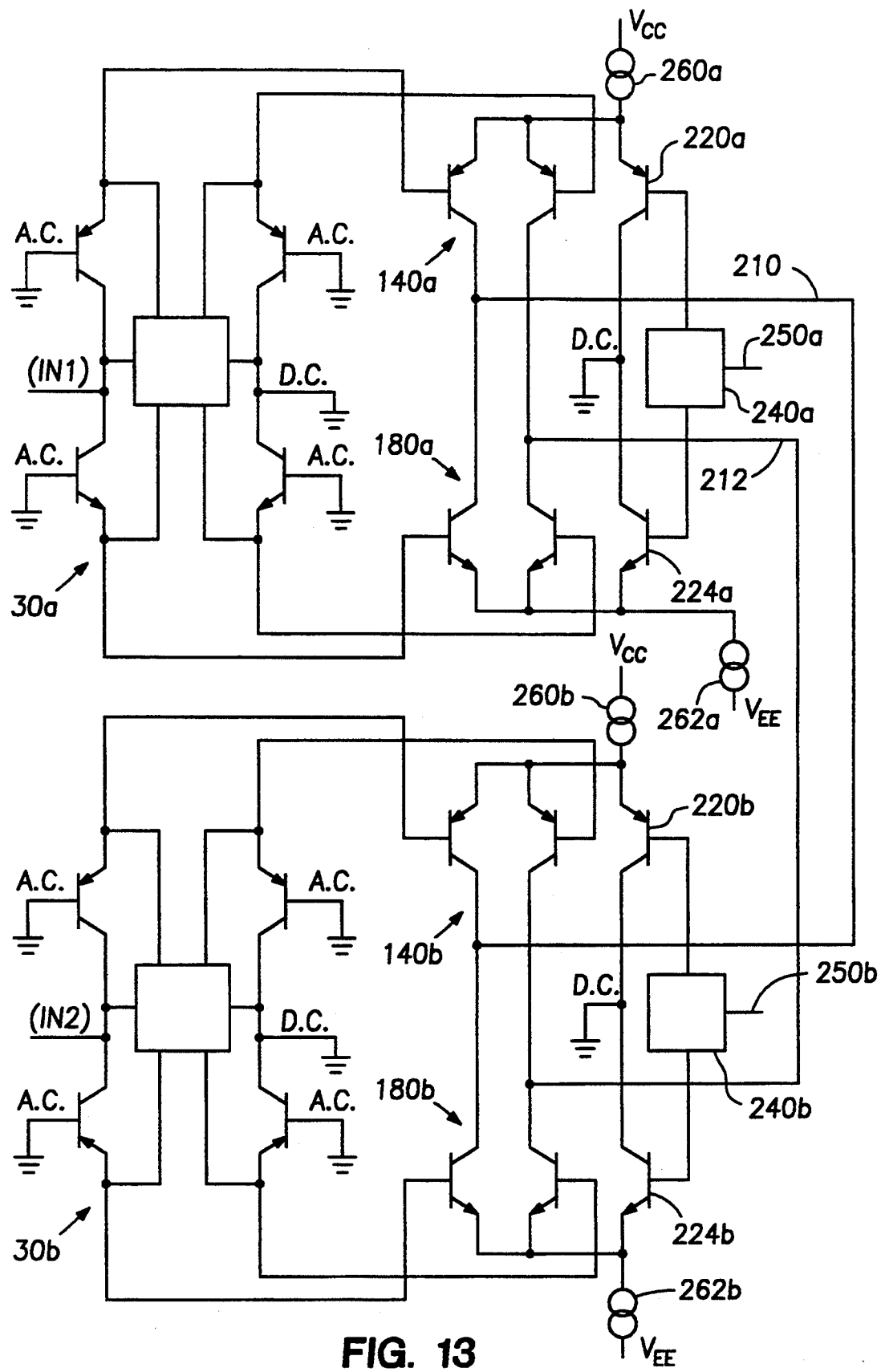
FIG. 13 shows a two to one dual switching circuit in accordance with the present invention.
Figure 14:
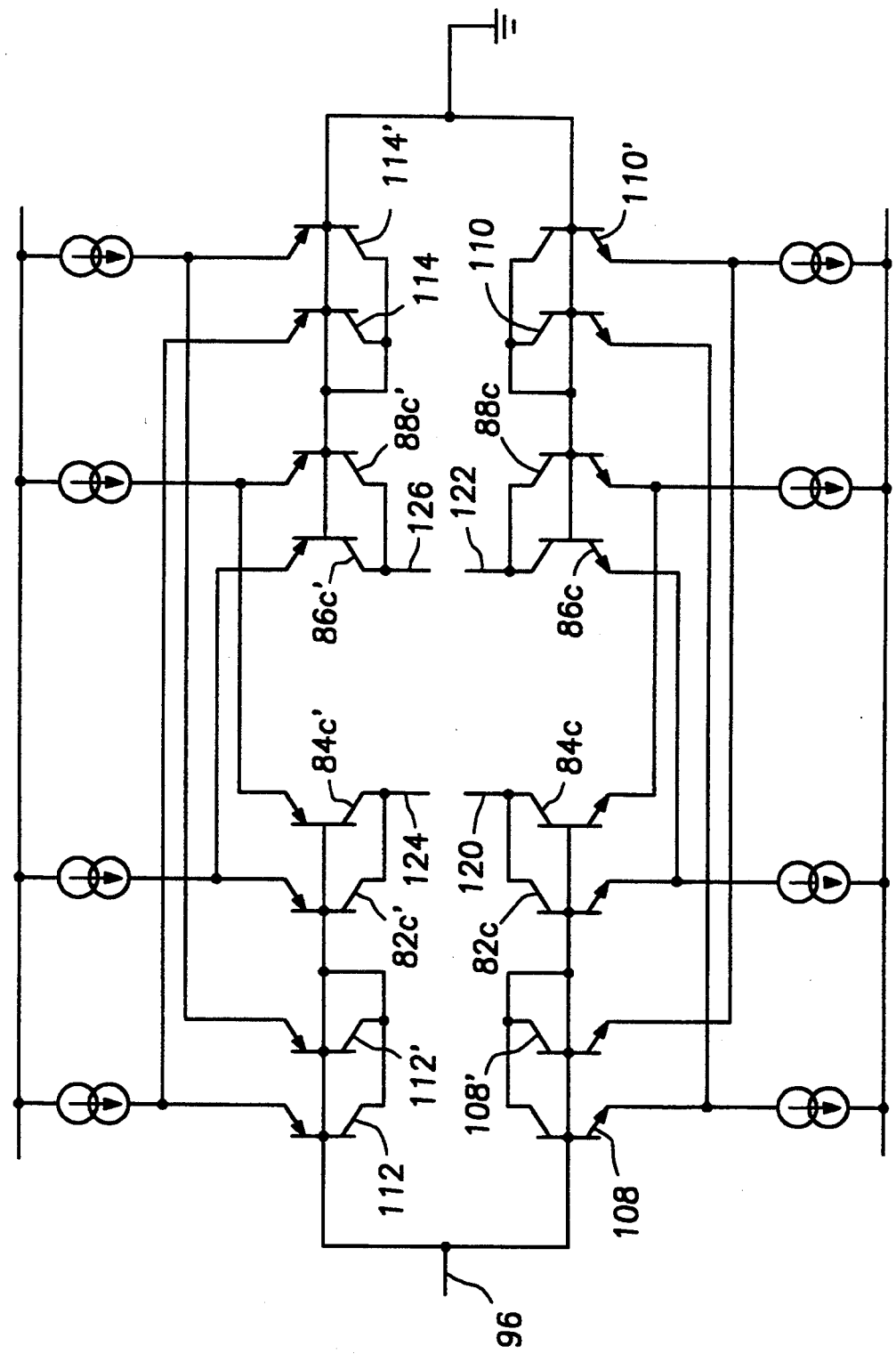
FIG. 14 is a schematic diagram of one embodiment of a differential amplifier for the Y input stage in accordance with the present invention.

Referring now to FIG. 13, there is shown an analog multiplexing circuit in accordance with the present invention. The circuit of FIG. 13 is a two to one dual switch having two X-input stages 30a, 30b, separate control inputs 250a, 250b, and common differential outputs 210, 212. The common emitters of differential amplifier pairs 140a, 180a and 140b, 180b are connected to fixed current sources 260a, 262a, and 210b, 212b, rather than to a Y-input amplifier as in the previous circuits. The circuit output is selected by means of shunt transistors 220a, 224a and 220b, 224b, which are switched on and off through switching circuits 240a, 240b by control inputs 250a, 250b, respectively. The circuit of FIG. 13 may be expanded to accommodate additional X-input stages.

What is claimed is:

1. A complementary multiplier for generating a product signal from two input signals, said multiplier comprising:

a first input amplifier having a pair of inputs and first and second pairs of outputs, for generating first and second pairs of currents at said first and second pairs of outputs from a first input signal applied between said pair of inputs, said first and second pairs of currents having opposite polarities;

a first pair of transistors each having a collector, a base coupled to AC ground, and an emitter coupled to one of said first pair of outputs of said first input amplifier, for generating first and second intermediate signals at the emitters of said first pair of transistors from said first pair of currents;

a second pair of transistors complementary to said first pair of transistors, each having a base coupled to AC ground, a collector connected to the collector of one of said first pair of transistors, and an emitter coupled to one of said second pair of outputs of said first input amplifier, for generating third and fourth intermediate signals at the emitters of said second pair of transistors from said second pair of currents;

a second input amplifier having a pair of inputs and first and second pairs of outputs for generating third and fourth pairs of currents at said first and second pairs of outputs, respectively of said second input amplifier from a second input signal applied between said pair of inputs, said third and fourth pairs of currents having opposite polarities;

a first pair of gain core differential amplifiers, each gain core differential amplifier having first and second input terminals for receiving said first and second intermediate signals, respectively, first and second output terminals corresponding to said first and second input terminals, and a third input terminal connected to receive one of said third pairs of currents for controlling the transconductance of said gain core differential amplifier, the first output terminal of each gain core differential amplifier of said first pair of gain core differential amplifiers being cross-connected to the second output terminal of the other gain core differential amplifier of said first pair of gain core differential amplifiers, said cross-connected output terminals forming first and second outputs of said complementary multiplier; and a second pair of gain core differential amplifiers complementary to said first pair of gain core differential amplifiers, each gain core differential amplifier having first and second input terminals for receiving said third and fourth intermediate signals, respectively, first and second output terminals corresponding to said first and second input terminals, and a third input terminal connected to receive one of said fourth pair of currents for controlling the transconductance of said gain core differential amplifier, the first output terminal of each gain core differential amplifier of said second pair of gain core differential amplifiers being cross-connected to the second output terminal of the other gain core differential amplifier of said second pair of gain core differential amplifiers, and also being connected to said one of said first and second outputs of the complementary multiplier, said first and second pairs of gain core differential amplifiers each having gain characteristics substantially matching the gain characteristics of said first and second pairs of transistors, respectively, for generating first and second output signals at said first and second outputs of the complementary multiplier proportional to the product of said first and second input signals.

2. A complementary multiplier according to claim 1, wherein said first and second input signals are first and second currents.

3. A complementary multiplier according to claim 1, wherein said first and second input signals are first and second voltages.

4. A complementary multiplier according to claim 2, wherein each of said gain core differential amplifiers of said first and second pairs of gain core differential amplifiers comprises a differentially connected transistor pair, each transistor of said transistor pair having a base, collector and emitter, the bases, collectors, and common emitters of said transistor pairs forming the first and second inputs, the first and second outputs, and the third input, respectively, of each of said gain core differential amplifiers of said first and second pairs of gain core differential amplifiers.

5. A complementary amplifier according to claim 4, wherein said first input amplifier comprises first and second differential amplifiers having complementary conductivity properties, each of said first and second differential amplifiers having a pair of inputs, a corresponding pair of outputs, and at least one current terminal connected to a current source, each input of said pair of inputs of said first differential amplifier being connected to one input of said pair of inputs of said second differential amplifier to form one of said pair of inputs of said first input amplifier, and said pair of outputs of said first and second differential amplifiers forming said first and second pairs of outputs, respectively, of said first input amplifier.

6. A complementary multiplier according to claim 5, wherein each of said first and second differential amplifiers of said first input amplifier comprises:

A first pair of transistors, each transistor of said first pair of transistors having a base, collector, and emitter, the bases and collectors of each of said first pair of transistors forming said pair of inputs and outputs, respectively, of said first input amplifier;

a second pair of transistors, the collector of each of said second pair of transistors being connected to the emitter of one of said first pair of transistors and the base of each of said second pair of transistors being connected to the collector of the other of said first pair of transistors, the emitters of said second pair of transistors being connected to a supply voltage through a current source, said emitters forming the at least one current terminal of said first input amplifier; and a resistor connected between the emitters of said second pair of transistors.

7. A complementary multiplier according to claim 5 wherein each of said first and second differential amplifiers of said first input amplifier comprises:

a first pair of transistors, each transistor of said first pair of transistors having a base, collector, and emitter, the bases and collectors of said first pair of transistors forming the pair of inputs and pair of outputs, respectively, of said first input amplifier and the emitters of said first pair of transistors being connected to a supply voltage through a current source to form said at least one current terminal of said first input amplifier; and a second pair of transistors, each transistor of said second pair of transistors having a base, collector, and emitter, the collector and base of each of said second pair of transistors being connected to the collector and base, respectively, of one of said first pair of transistors, and the emitters of each of said second pair of transistors being connected to the emitter of the other transistor of said first pair of transistors, the emitter areas of each of said first pair of transistors being a multiple of the emitter areas of said second pair of transistors.

8. A complementary multiplier according to claim 7, wherein the emitter areas of said first pair of transistors are between three times and seven times greater than the emitter areas of said second pair of transistors.

9. A complementary multiplier according to claim 8, wherein the emitter areas of said first pair of transistors are five times greater than the emitter areas of said second pair of transistors.

10. A complementary multiplier according to claim 5, wherein said second input amplifier comprises first and second differential amplifiers having complementary conductivity properties, each of said first and second differential amplifiers having a pair of inputs, a corresponding pair of outputs, and at least one current terminal, each input of said pair of inputs of said first differential amplifier being connected to one of said pair of inputs of said second differential amplifier to form said pair of inputs of said second input amplifier, said pair of outputs of said first and second differential amplifiers forming said first and second pair of outputs, respectively of said second input amplifier.

11. A complementary multiplier according to claim 5, wherein each of said first and second differential amplifiers of said first input amplifier comprises a pair of differentially connected transistors, each transistor having a collector, emitter, and base, the bases, collectors, and emitters of each pair of differentially connected transistors forming the pair of inputs, pair of outputs, and at least one current terminal, respectively, of said first and second differential amplifiers of said first input amplifier.

12. The complementary multiplier of claim 10, wherein said second input amplifier further comprises complementary third and fourth differential amplifiers each having a pair of inputs, a corresponding pair of outputs, at least one current terminal, and a configuration that is substantially identical to said first and second differential amplifiers, respectively, with each input of said pair of inputs of said third and fourth differential amplifiers being connected to the corresponding output of said pair of outputs of said third and fourth differential amplifiers and to one of said pair of inputs of said second input amplifier, for reducing the input impedance of said second input amplifier.

13. The complementary multiplier of claim 12, wherein each of said first and second differential amplifiers comprises a pair of differentially-connected transistors, each transistor having a base, collector, and emitter, the bases and collectors of each of said pairs of differentially-connected transistors forming the pair of inputs and corresponding pair of outputs of one of said first and second differential amplifiers, and the emitters of each of said pairs of differentially-connected transistors forming the at least one current terminal of one of said first and second differential amplifiers.

14. A complementary multiplier according to claim 12, wherein each of said first and second differential amplifiers comprises:
a first pair of transistors each having a base, collector, and emitter, the bases and collectors of said first pair of transistors forming one of said pair of inputs and said corresponding pair of outputs, respectively, of said second input amplifier, the emitters of each of said first pair of transistors forming said at least one current terminal; and
a second pair of transistors each having a base, collector, and emitter, the collector and base of each transistor of said second pair of transistors being connected to the collector and base, respectively, of one of the transistors of said first pair of transistors, and the emitter of each of said second pair of transistors being connected to the emitter of the other transistor of said first pair of transistors, the emitter area of each of said first pair of transistors being between three times and seven times greater than the emitter area of each of said second pair of transistors.

15. A complementary multiplier circuit according to claim 1, wherein a shunt circuit is connected between the third input terminal of said first and second pairs of gain core differential amplifiers and AC ground, said shunt circuit comprising:
a first pair of shunt transistors each transistor of said first pair of shunt transistors having a base, collector, and emitter, and each having its collector connected to AC ground, its emitter connected to the third input terminal of one of said first pair of gain core differential amplifiers, and its base connected to switching circuitry; and
a second pair of shunt transistors, complementary to said first pair of shunt transistors, each of said second pair of shunt transistors having a base, collector, and emitter, and each having its collector connected to AC ground, its emitter connected to the third input terminal of one of said second pair of gain core differential amplifiers, and its base connected to said switching circuitry, said first and second pair of shunt transistors being effective to shut off said first and second gain core differential amplifier pairs when activated by said switching circuitry.

16. A complementary multiplier according to claim 4, wherein the transistors of said first pair of differential amplifiers and the transistors of said second pair of differential amplifiers are arrayed in separate lines on a substantially rectangular semiconductor chip,
said separate lines of transistors being oriented substantially parallel to each other and to opposite edges of said semiconductor chip, and further being located equal distance from and on opposite sides of a midline bisecting said opposite edges of said semiconductor chip, for canceling the effects of thermal, diffusion, and die stress gradients on the transistors comprising said first and second pairs of differential amplifiers.

17. A complementary multiplier for generating a product signal from two input signals, said multiplier comprising:
a first input amplifier having a pair of inputs and first and second pairs of outputs, for generating first and second pairs of currents at said first and second pairs of outputs from a first input signal applied between said pair of inputs, said first and second pairs of currents having opposite polarities;
a first pair of transistors, each having a collector, a base coupled to AC ground, and an emitter coupled to one of said first pair of outputs of said first input amplifier, for generating first and second intermediate signals from said first pair of currents;
a second pair of transistors complementary to said first pair of transistors, each having a base coupled to AC ground, a collector connected to the collector of one of said first pair of transistors, and an emitter coupled to one of said second pair of outputs of said first input amplifier, for generating third and fourth intermediate signals from said second pair of currents;

a second input amplifier having a pair of inputs and first and second outputs for generating a third pair of currents at said first and second outputs from a second input signal applied between said pair of inputs, said third pair of currents having opposite polarities;

a first gain core differential amplifier having first and second input terminals for receiving said first and second intermediate signals, respectively, first and second output terminals corresponding to said first and second input terminals, and a third input terminal for controlling the transconductance of said first gain core differential amplifier with one of said third pair of currents;

a second gain core differential amplifier complimentary to said first gain core differential amplifier, having first and second input terminals for receiving said third and fourth intermediate signals, respectively, first and second output terminals corresponding to said first and second input terminals, and a third input terminal for controlling the transconductance of said differential amplifier with the other of said third pair of currents, said first and second outputs of said second gain control differential amplifier being connected to said first and second outputs, respectively, of said first gain control amplifier to form first and second multiplier outputs, said first and second gain core differential amplifiers each having gain characteristics substantially matching those of said first and second pairs of transistors, respectively, for generating output signals having equal magnitudes and opposite polarities at said first and second multiplier outputs.

18. A complementary multiplier according to claim 17, wherein a shunt circuit is connected between the third terminal of each of s,id first and second gain core differential amplifiers and AC ground, said shunt circuit comprising:

a first shunt transistor having a base, collector, and emitter and having its collector connected to AC ground, its emitter connected to the third input of said first gain core differential amplifier, and its base connected to switching circuitry; and a second shunt transistor complementary to said first shunt transistor, having a base, collector, and emitter and having its collector connected to AC ground, its emitter connected to the third input of said second gain core differential amplifier, and its base connected to said switching circuitry, said first and second shunt transistors being effective to shut off said first and second gain core differential amplifiers when activated by said switching circuitry.

19. A differential amplifier input stage for generating balanced differential output signals suitable for driving complementary, differential stages, said input stage comprising:

an input amplifier having a pair of inputs and first and second pairs of outputs for generating first and second pairs of currents at said first and second pairs of outputs from a first input signal applied between said pair of inputs, said first and second pairs of currents having opposite polarities;

a first pair of transistors, each transistor of said first pair of transistors having a collector, a base coupled to AC ground, and an emitter coupled to one of said first pair of outputs of said first input amplifier, for generating first and second intermediate signals at the emitters of said first pair of transistors from said first pair of currents, the emitters of said first pair of transistors forming a first differential output of the differential amplifier input stage, for providing a first differential output signal equal to the difference between said first and second intermediate signals;

a second pair of transistors complementary to said first pair of transistors, each transistor of said second pair of transistors having a base coupled to AC ground, a collector connected to the collector of one of said first pair of transistors, and an emitter coupled to one of said second pair of outputs of said first input amplifier, for generating third and fourth intermediate signals at the emitters of said second pair of transistors from said second pair of currents, the emitters of said second pair of transistors forming a second differential output of the differential amplifier input stage, for providing a second differential output signal equal to the difference between said third and fourth intermediate signals said first differential output signal being equal to said second differential output signal.

20. A differential amplifier input stage according to claim 19, further comprising:

a second input amplifier having a pair of inputs and first and second pairs of outputs for generating third and fourth pairs of currents at said first and second pairs of outputs from a second input signal applied between said pair of inputs, said third and fourth pairs of currents having opposite polarities;

a first pair of gain core differential amplifiers each having first and second input terminals for receiving said first differential output signal, first and second output terminals corresponding to said first and second input terminals, and a third input terminal connected to receive one of said third pair of currents for controlling the transconductance of each of said first pair of gain control differential amplifiers, the first output terminal of each gain core differential amplifier of said first pair of gain core differential amplifiers being cross-connected to the second output terminal of the other gain core differential amplifier of said first pair of gain core differential amplifiers, said cross-connected output terminals forming first and second multiplier outputs;

a second pair of gain core differential amplifiers complementary to said first pair of gain core differential amplifiers, each having first and second input terminals for receiving said second differential output signal, first and second output terminals corresponding to said first and second input terminals, and a third input terminal connected to receive one of said fourth pair of currents for controlling the transconductance of each of said second pair of gain core differential amplifiers, the first output terminal of each gain core differential amplifier of said second pair of gain core differential amplifiers being cross-connected to the second output terminal of the other gain core differential amplifier of said second pair of gain core differential amplifiers, and also being connected to said one of said first and second multiplier output terminals, said first and second pairs of gain core differential amplifiers each having gain characteristics substantially matching those of said first and second pairs of transistors, respectively, said input stage, second input amplifier, and first and second pairs of gain control differential amplifiers generating a pair of product signals at said first and second multiplier outputs terminals, said product signals having opposite phases.

21. A differential amplifier input stage according to claim 19, further comprising:

a second input amplifier having a pair of inputs and first and second outputs for generating a third pair of currents at said first and second outputs from a second input signal applied between said pair of inputs, said third pair of currents having opposite polarities;

a first gain core differential amplifier having first and second terminals for receiving said first differential output signal, first and second output terminals corresponding to said first and second input terminals, and a third input terminal connected to receive one of said third pair of current for controlling the transconductance of said differential amplifier;

a second gain core differential amplifier complementary to said first gain core differential amplifier, having first and second input terminals for receiving said second differential output signal, first and second output terminals corresponding to said first and second input terminals, the first and second output terminal of said second differential amplifier being connected to the first and second output terminals of said first gain core differential amplifier to form first and second multiplier output terminals, and a third input terminal connected to receive the other of said third pair of currents for controlling the transconductance of said second gain core differential amplifier, said first and second gain core differential amplifiers each having gain characteristics substantially matching those of said first and second pairs of transistors, respectively, said input stage, second input amplifier, and first and second gain control differential amplifiers generating a pair of product signals at each of said multiplier output terminals, said product signals having opposite polarities.

22. A differential amplifier input stage according to claim 21, further comprising a shunt circuit, said shunt circuit comprising;

a first shunt transistor having a base, collector, and emitter and having its collector connected to AC ground, its emitter connected to the third input of said first gain control differential amplifier, and its base connected to switching circuitry; and a second shunt transistor complementary to said first shunt transistor having abase, collector, and emitter and having its collector connected to AC ground, its emitter connected to the third input of said second gain core differential amplifier, and its base connected to said switching circuitry, said first and second shunt transistors turning on and off said first and second gain core differential amplifiers in response to a third signal input to said switching circuitry, said input stage, second input amplifier, first and second gain control differential amplifiers, and shunt circuit providing product signals that can be switched rapidly between on and off states.

23. A differential amplifier input stage according to claim 19, further comprising:

a pair of complementary current sources each having an input connected to a voltage supply and an output for providing one of a third pair of currents;

a first gain core differential amplifier having first and second terminals for receiving said first and second intermediates signals, respectively, first and second output terminals corresponding to said first and second input terminals, and a third input terminal connected to receive one of said third pair of currents for controlling the transconductance of said first gain core differential amplifier:

a second gain core differential amplifier complementary to said first gain core differential amplifier, having first and second input terminals for receiving said third and fourth intermediate signals, respectively, first and second output terminals corresponding to said first and second input terminals and being connected to said first and second output terminals of said first gain core differential amplifier to form first and second output terminals, and a third input terminal connected to receive the other of said third pair of currents for controlling the transconductance of said second main core differential amplifier, said first and second gain core differential amplifiers each having main characteristics substantially matching those of said first and second pairs of transistors, respectively, said input stage, complementary current sources, and first and second gain core differential amplifiers forming a voltage controlled amplifier for providing amplified versions of input signals applied to said pair of inputs at said first and second output terminals.

24. A differential amplifier input stage according to claim 23, further comprising:

a first shunt transistor having a base, collector, and emitter and having its collector connected to AC ground, its emitter connected to the third input of said first gain control differential amplifier, and its base connected to switching circuitry; and a second shunt transistor complementary 1o said first shunt transistor having a base, collector, and emitter and having its collector connected to AC ground, its emitter connected to the third input of said second gain core differential amplifier, and its base connected to said switching circuitry, said first and second shunt transistors turning on and off said first and second gain core differential amplifiers in response to a third signal input to said switching circuitry, said input stage, complementary current sources, first and second gain core differential amplifiers, and first and second shunt transistors forming a switchable voltage controlled amplifier for providing amplified versions of a pair of input signals at said first and second output terminals that can be turned on and off rapidly in response to a third input signal.

25. A differential amplifier input stage according to claim 24, further comprising a second differential amplifier input stage, complementary pair of current sources, first and second gain control differential amplifiers, and first and second shunt transistors forming a second switchable voltage controlled amplifier, the first and second output terminals of said first switchable voltage controlled amplifier being connected to the first and second output terminals, respectively, of said second switchable voltage controlled amplifier to form a first and second multiplexer outputs for switching input signals applied to said first and second switchable voltage controlled amplifiers to said multiplexer outputs in response to third signals applied to the switching circuitry of said first and second voltage controlled amplifiers.

26. The differential amplifier input stage of claim 23 further comprising a plurality of dual differential amplifier input stages, complementary pairs of current sources, first and second gain control differential amplifiers, first and second shunt transistors, and cross-connecting means to form a plurality of switchable voltage controlled amplifiers, the first and second of output terminals of each of said plurality of switching circuits being connected to the first and second output terminals, respectively, of each of the plurality of switchable, voltage controlled amplifiers to form first and second multiplexer outputs, for switching signals applied to the inputs of each of said plurality of switchable, voltage controlled amplifiers to said first and second multiplexer outputs in response to third signals applied to the switching circuitry of each of said plurality of switchable, voltage controlled amplifiers.

* * * * *